United States Patent
Yu et al.

(10) Patent No.: US 10,510,735 B2
(45) Date of Patent: *Dec. 17, 2019

(54) PACKAGES AND METHODS OF FORMING PACKAGES

(71) Applicant: Taiwan Semiconductor Manufacturing Company, Ltd., Hsinchu (TW)

(72) Inventors: Chen-Hua Yu, Hsinchu (TW); Der-Chyang Yeh, Hsinchu (TW); An-Jhih Su, Taoyuan (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 16/222,644

(22) Filed: Dec. 17, 2018

(65) Prior Publication Data

US 2019/0115332 A1    Apr. 18, 2019

Related U.S. Application Data

(63) Continuation of application No. 15/496,842, filed on Apr. 25, 2017, now Pat. No. 10,157,899, which is a (Continued)

(51) Int. Cl.
*H01L 25/16* (2006.01)
*H01L 23/00* (2006.01)
(Continued)

(52) U.S. Cl.
CPC .............. *H01L 25/16* (2013.01); *H01L 21/56* (2013.01); *H01L 23/50* (2013.01); *H01L 23/5386* (2013.01); *H01L 23/5389* (2013.01); *H01L 23/58* (2013.01); *H01L 24/03* (2013.01); *H01L 24/09* (2013.01); *H01L 24/19* (2013.01); *H01L 24/20* (2013.01); *H01L 24/24* (2013.01);
(Continued)

(58) Field of Classification Search
CPC ................ H01L 2924/01079; H01L 25/0657
See application file for complete search history.

(56) References Cited

U.S. PATENT DOCUMENTS 8,093,722 B2    1/2012    Chen et al.
8,174,119 B2    5/2012    Pendse
(Continued)

FOREIGN PATENT DOCUMENTS

KR    20120045936 A    5/2012
TW    201342557 A    10/2013

*Primary Examiner* — Fernando L Toledo
*Assistant Examiner* — Neil R Prasad
(74) *Attorney, Agent, or Firm* — Slater Matsil, LLP

(57) ABSTRACT

Various packages and methods of forming packages are discussed. According to an embodiment, a package includes a processor die at least laterally encapsulated by an encapsulant, a memory die at least laterally encapsulated by the encapsulant, and a redistribution structure on the encapsulant. The processor die is communicatively coupled to the memory die through the redistribution structure. According to further embodiments, the memory die can include memory that is a cache of the processor die, and the memory die can comprise dynamic random access memory (DRAM).

20 Claims, 13 Drawing Sheets

Related U.S. Application Data continuation of application No. 14/554,949, filed on Nov. 26, 2014, now Pat. No. 9,646,955.

(60) Provisional application No. 62/046,718, filed on Sep. 5, 2014.

(51) Int. Cl.
| | | |
|---|---|---|
| *H01L 23/538* | (2006.01) | |
| *H01L 21/56* | (2006.01) | |
| *H01L 25/00* | (2006.01) | |
| *H01L 23/50* | (2006.01) | |
| *H01L 23/58* | (2006.01) | |
| *H01L 21/66* | (2006.01) | |

(52) U.S. Cl.
CPC .............. *H01L 24/97* (2013.01); *H01L 25/50* (2013.01); *H01L 21/561* (2013.01); *H01L 21/568* (2013.01); *H01L 22/32* (2013.01); *H01L 2224/04105* (2013.01); *H01L 2224/12105* (2013.01); *H01L 2224/24137* (2013.01); *H01L 2224/32225* (2013.01); *H01L 2224/73267* (2013.01); *H01L 2224/94* (2013.01); *H01L 2924/10252* (2013.01); *H01L 2924/10253* (2013.01); *H01L 2924/10271* (2013.01); *H01L 2924/10272* (2013.01); *H01L 2924/10329* (2013.01); *H01L 2924/10333* (2013.01); *H01L 2924/10335* (2013.01); *H01L 2924/10342* (2013.01); *H01L 2924/14* (2013.01); *H01L 2924/1432* (2013.01); *H01L 2924/1436* (2013.01); *H01L 2924/1437* (2013.01); *H01L 2924/18162* (2013.01)

(56) References Cited

U.S. PATENT DOCUMENTS

| | | |
|---|---|---|
| 8,237,259 B2 | 8/2012 | Pressel et al. |
| 8,786,103 B2 | 7/2014 | Uchiyama et al. |
| 9,646,955 B2 | 5/2017 | Yu et al. |
| 2004/0178488 A1* | 9/2004 | Bolken ............... H01L 23/3128 257/686 |
| 2010/0258944 A1 | 10/2010 | Uchiyama et al. |
| 2012/0098123 A1 | 4/2012 | Yu et al. |
| 2013/0267066 A1 | 10/2013 | Park et al. |
| 2013/0270682 A1 | 10/2013 | Hu et al. |
| 2014/0042623 A1 | 2/2014 | Wang et al. |
| 2015/0140736 A1 | 5/2015 | Pendse |

\* cited by examiner

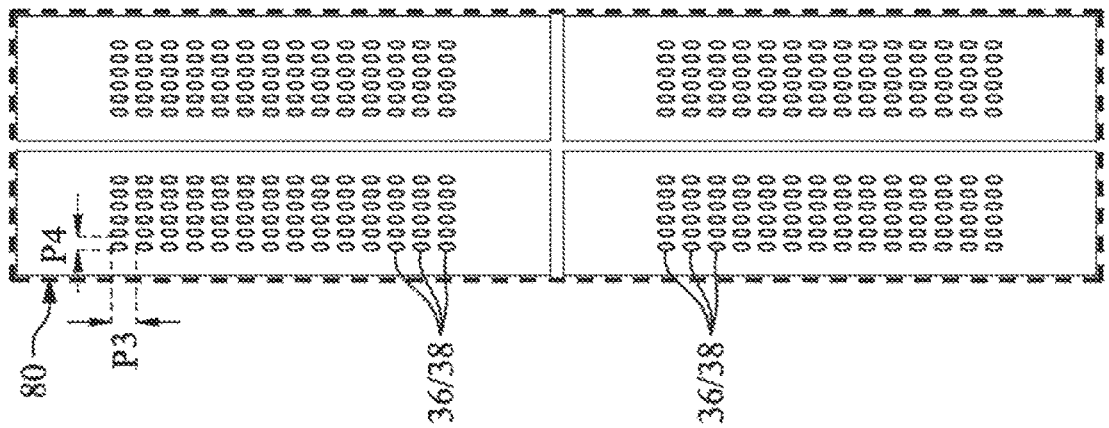
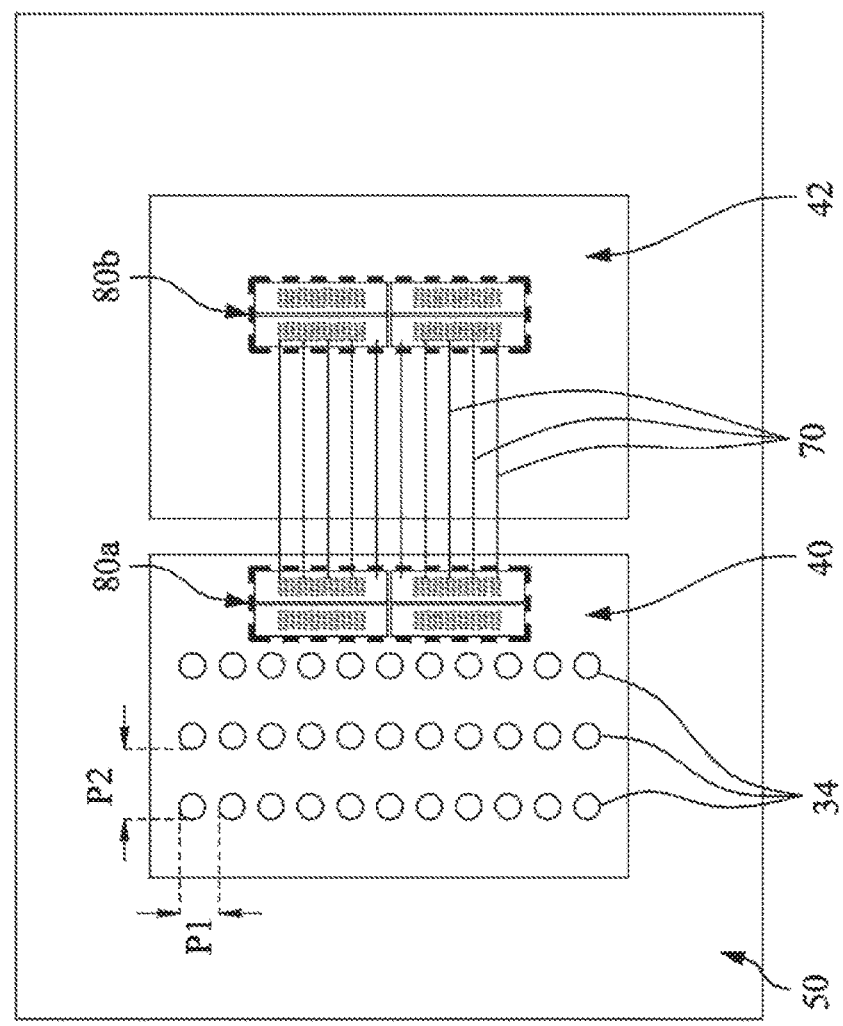
Fig. 2B
Fig. 2A

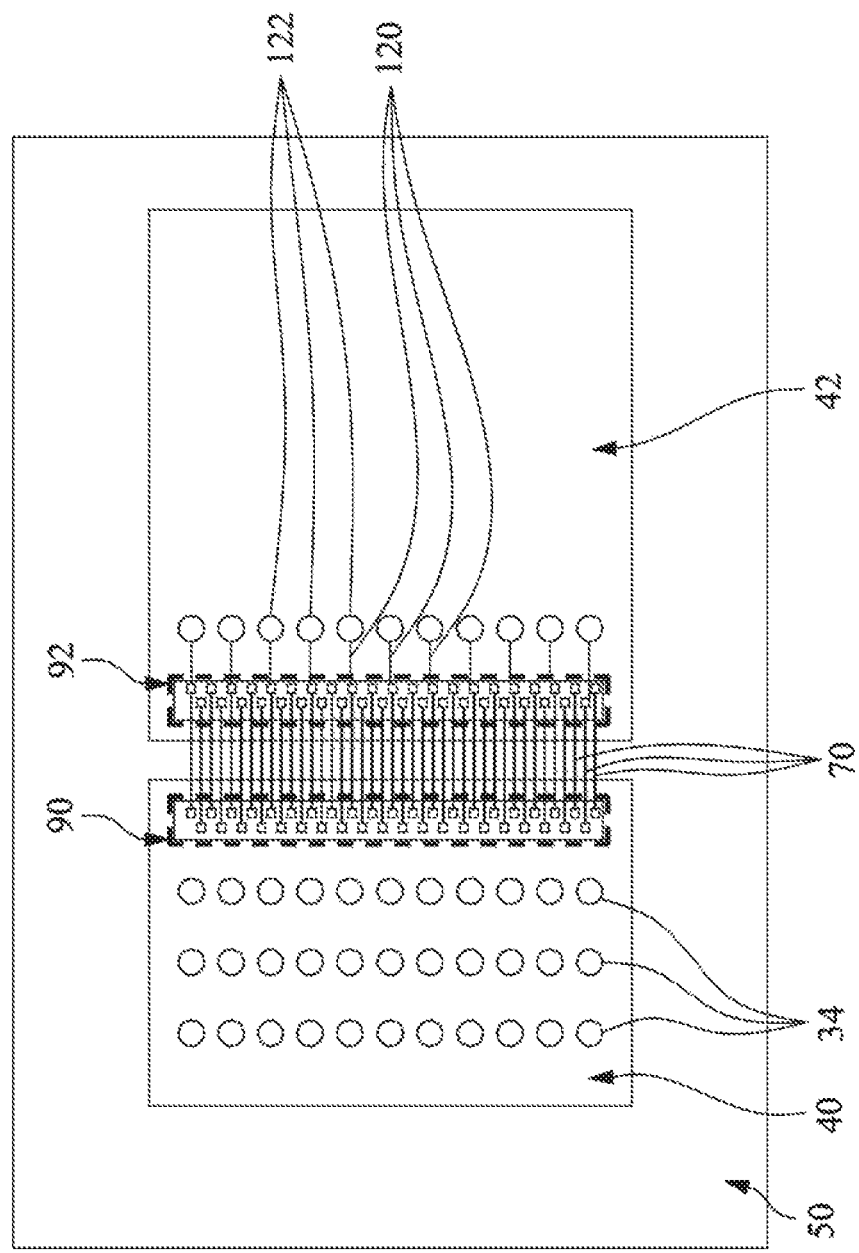

PACKAGES AND METHODS OF FORMING PACKAGES

PRIORITY CLAIM AND CROSS-REFERENCE

This application is a continuation of U.S. patent application Ser. No. 15/496,842, filed on Apr. 25, 2017, and entitled "Packages and Methods of Forming Packages," which is a continuation of U.S. patent application Ser. No. 14/554,949, filed on Nov. 26, 2014 (now U.S. Pat. No. 9,646,955 issued May 9, 2017), and entitled "Packages and Methods of Forming Packages," which claims the benefit of U.S. Provisional Application No. 62/046,718, filed on Sep. 5, 2014, and entitled "Cache Application by Fan-Out Package," which applications are incorporated herein by reference in its entirety.

BACKGROUND

In conventional processor architecture, caches of a Central Processing Unit (CPU) or Accelerated Processor Unit (APU) usually are embedded Static Random Access Memory (SRAM) in a System on Chip (SoC) device, or typically are an external SRAM chip for System in Package (SiP) devices. The SRAM architecture may be less efficient in terms of chip area and generally is more expensive than other memory architectures. Advanced technology nodes (e.g., below 20 nm nodes, such as 16 nm fin field effect transistor (FinFET) nodes and the like) may not offer embedded SRAM for SoC devices, such as due to the difficulty of manufacturing embedded SRAM in such nodes.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 2A and 2B are layout views of a cross section of the first package of FIG. 1, and with overlaid die-to-die connections, in accordance with some embodiments.

FIG. 8 is a layout view of a cross section of the fourth package of FIG. 7, and with overlaid die-to-die connections, in accordance with some embodiments.

DETAILED DESCRIPTION

Figure 1:
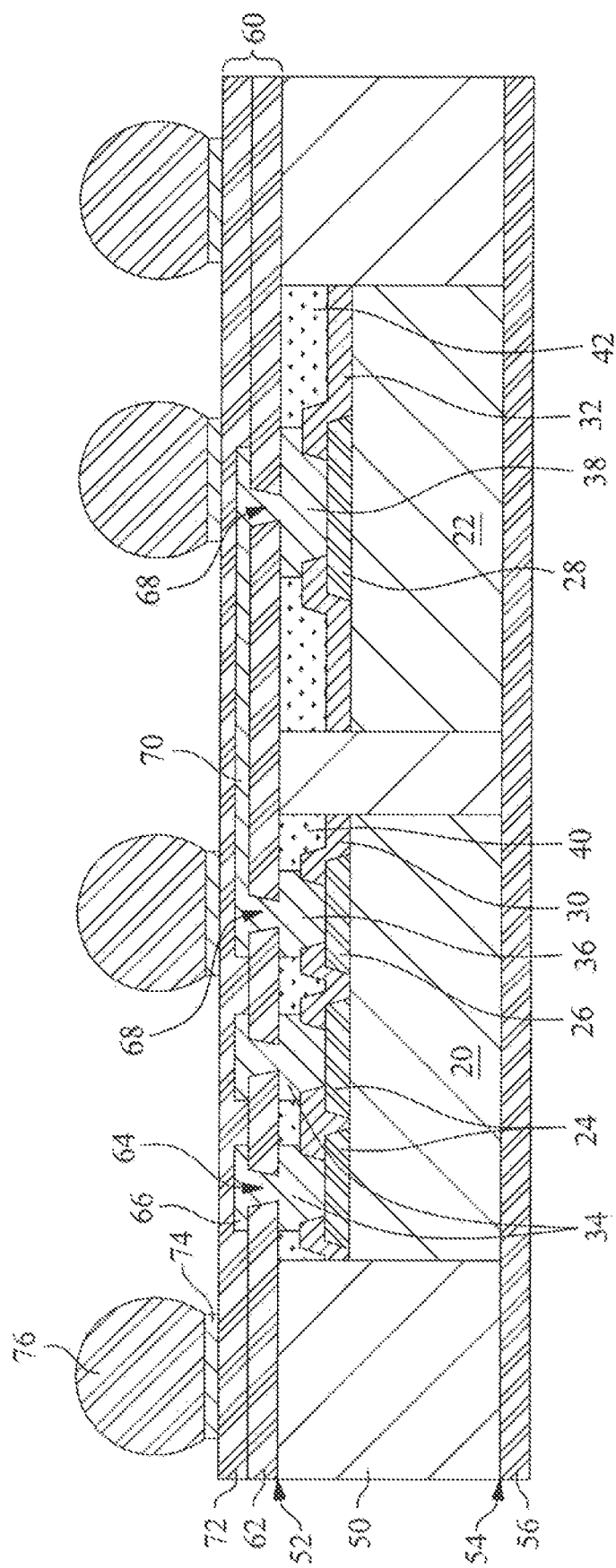
FIG. 1 illustrates a first package in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Embodiments discussed herein may be discussed in a specific context, namely a fan-out or fan-in wafer-level package. More specifically, some embodiments relate to a first integrated circuit die and a second integrated circuit die being interconnected by a redistribution structure in the package. In such a manner in some embodiments, a second integrated circuit die may provide a cache, such as of Dynamic Random Access Memory (DRAM), to the first integrated circuit die, which may be a processor, such as a Central Processing Unit (CPU) or Accelerated Processor Unit (APU). Other embodiments contemplate other applications, such as different package types or different configurations that would be readily apparent to a person of ordinary skill in the art upon reading this disclosure. It should be noted that embodiments discussed herein may not necessarily illustrate every component or feature that may be present in a structure. For example, multiples of a component may be omitted from a figure, such as when discussion of one of the components may be sufficient to convey aspects of the embodiment. Further, method embodiments discussed herein may be discussed as being performed in a particular order; however, other method embodiments may be performed in any logical order.

FIG. 1 illustrates a package in accordance with some embodiments. The package comprises a first integrated circuit die 20 and a second integrated circuit die 22 encapsulated by an encapsulant 50. According to some embodiments, the first integrated circuit die 20 comprises integrated circuitry of a processor, such as a CPU, an APU, or the like, and the second integrated circuit die 22 comprises integrated circuitry of memory, such as DRAM or the like. In this example, the second integrated circuit die 22 conforms to the Joint Electron Devices Engineering Council (JEDEC) Wide Input/Output (I/O) or Wide I/O 2 standard specification.

The first integrated circuit die 20 and the second integrated circuit die 22 may be processed according to applicable manufacturing processes to form the integrated circuits. For example, the integrated circuit dies 20 and 22 may each comprise a bulk semiconductor substrate, a semiconductor-on-insulator (SOI) substrate, multi-layered or gradient substrates, or the like. Generally, an SOI substrate comprises a layer of a semiconductor material formed on an insulator layer, such as a buried oxide (BOX), silicon oxide, or the like, on a substrate. A semiconductor material of the substrate can be an elemental semiconductor, such as silicon, germanium, or the like; compound materials such as silicon germanium, silicon carbide, gallium arsenic, indium arsenide, indium phosphide, silicon germanium carbide, gallium arsenic phosphide, gallium indium phosphide, a combination of these, and the like; or the like. Devices, such as transistors, diodes, capacitors, resistors, etc., may be formed in and/or on the semiconductor substrate and may be interconnected by interconnect structures formed by, for example, metallization patterns in one or more dielectric layers on the semiconductor substrate to form an integrated circuit.

The first integrated circuit die 20 further comprises pads 24 and 26, such as aluminum pads, to which external connections are made, and the second integrated circuit die 22 further comprises pads 28, such as aluminum pads, to which external connections are made. The pads 24, 26, and 28 are on what may be referred to as active sides of the respective integrated circuit dies 20 and 22. Passivation film 30 is on the first integrated circuit die 20 and on portions of the pads 24 and 26, and passivation film 32 is on the second integrated circuit die 22 and on portions of the pads 28. Openings are through the passivation films 30 and 32 to the respective pads 24, 26, and 28.

Die connectors 34, 36, and 38, such as conductive pillars (for example, comprising a metal such as copper), are in the openings through passivation films 30 and 32 and are mechanically and electrically coupled to the respective pads 24, 26, and 28. The die connectors 34, 36, and 38 electrically couple the respective integrated circuits of the first integrated circuit die 20 and the second integrated circuit die 22. A reduced number of die connectors is shown on each of the first integrated circuit die 20 and the second integrated circuit die 22 for clarity and simplicity, and one of ordinary skill in the art will readily understand that more die connectors may be present. Further, the relative sizes and/or pitches of the die connectors may be exaggerated in the illustration to more clearly convey various concepts. More details of the die connectors 34, 36, and 38 are discussed with respect to FIGS. 2A and 2B.

A dielectric material 40 is on the active side of the first integrated circuit die 20, such as on the passivation film 30 and the die connectors 34 and 36, and a dielectric material 42 is on the active side of the second integrated circuit die 22, such as on the passivation film 32 and the die connectors 38. The dielectric material 40 laterally encapsulates the die connectors 34 and 36, and the dielectric material 40 is laterally co-terminus with the first integrated circuit die 20. Similarly, the dielectric material 42 laterally encapsulates the die connectors 38, and the dielectric material 42 is laterally co-terminus with the second integrated circuit die 22. The dielectric materials 40 and 42 may be a polymer such as polybenzoxazole (PBO), polyimide, benzocyclobutene (BCB), or the like; a nitride such as silicon nitride or the like; an oxide such as silicon oxide, PhosphoSilicate Glass (PSG), BoroSilicate Glass (BSG), Boron-doped PhosphoSilicate Glass (BPSG), or the like; the like, or a combination thereof.

The encapsulant 50 laterally encapsulates the first integrated circuit die 20 and the second integrated circuit die 22. The encapsulant 50 may be a molding compound, epoxy, or the like. A first surface 52 of the encapsulant 50 is co-planar with surfaces of the dielectric materials 40 and 42 and of the die connectors 34, 36, and 38. A second surface 54 of the encapsulant 50 opposite from the first surface 52 is co-planar with surfaces of backsides (e.g., opposite from the active sides) of the first integrated circuit die 20 and the second integrated circuit die 22. In other embodiments, the various surfaces may not be co-planar. As illustrated, a die-attach-film (DAF) 56, which may be an adhesive film, is on the second surface 54 of the encapsulant 50 and the surfaces of the backsides of the first integrated circuit die 20 and the second integrated circuit die 22. In some embodiments, the DAF 56 may be omitted.

A redistribution structure 60 is on the first surface 52 of the encapsulant 50 and on surfaces of the dielectric material 40 and 42 and die connectors 34, 36, and 38. The redistribution structure 60 comprises a first dielectric layer 62, a second dielectric layer 72, and various metallization patterns and vias. The first dielectric layer 62 is on the first surface 52 of the encapsulant 50 and on surfaces of the dielectric material 40 and 42. Vias, such as vias 64 and 68, are through the first dielectric layer 62 and are directly coupled to respective die connectors 34, 36, and 38. A metallization pattern 66 is on the first dielectric layer 62. The second dielectric layer 72 is on the metallization pattern 66 and the first dielectric layer 62. Openings (not shown) are through the second dielectric layer 72, and a metallization pattern is formed in the openings and to form bond pads 74 on the second dielectric layer 72. The first dielectric layer 62 and the second dielectric layer 72 may be a polymer such as PBO, polyimide, BCB, or the like; a nitride such as silicon nitride; an oxide such as silicon oxide, PSG, BSG, BPSG; or the like. The various metallization patterns, vias, and bond pads may comprise a metal, like copper, titanium, tungsten, aluminum, the like, or a combination thereof. The redistribution structure 60 can comprise any number of dielectric layers and metallization patterns. External electrical connectors 76 are on the bond pads 74. The external electrical connectors 76 may include a low-temperature reflowable material such as solder, which may be lead-free or lead-containing. The external electrical connectors 76 may be a ball grid array (BGA).

Vias 68 and a line 70 in the metallization pattern 66 form a die-to-die connection within the redistribution structure. The die connector 36 on the first integrated circuit die 20 is directly coupled to a via 68, which is directly coupled to the line 70. The line 70 is directly coupled to another via 68, which is directly coupled to the die connector 38 on the second integrated circuit die 22. Hence, the first integrated circuit die 20 and the second integrated circuit die 22 are communicatively coupled within the package, e.g., through the redistribution structure 60, without the need for any connection exterior to the package. The illustrated die-to-die connection of FIG. 1 is show as an example, and other configurations for a die-to-die connection within a redistribution structure of a package may be used.

FIG. 2A is a layout view of the first surface 52 of the encapsulant 50, surfaces of the dielectric materials 40 and 42, surfaces of the die connectors 34, 36, and 38, and with overlaid die-to-die connections, in accordance with some embodiments. The die connectors 34 are generally arranged as an array on the first integrated circuit die 20. The die connectors 34 can have a first pitch P1 (e.g., in a y-direction) and a second pitch P2 (e.g., in an x-direction) between respective neighboring pairs of the die connectors 34. Each of the first pitch P1 and the second pitch P2 of the die connectors 34 can be between about 20 µm and about 150 µm, such as about 80 µm. The die connectors 36 are generally arranged in an area 80a on the first integrated circuit die 20, and the die connectors 38 are generally arranged in an area 80b on the second integrated circuit die 22. The area 80b on the second integrated circuit die 22 is generally centrally located on the second integrated circuit die 22. Lines 70 are illustrated between the areas 80a and 80b to illustrate die-to-die connections between die connectors 36 of the first integrated circuit die 20 and die connectors 38 of the second integrated circuit die 22. The areas 80a and 80b are generically depicted in greater detail as area 80 in FIG. 2B. Four quadrants, each comprising an array of die connectors 36/38 (die connectors 36 for the first integrated circuit die 20, and die connectors 38 for the second integrated circuit die 22), are in the area 80. The die connectors 36/38 can have a first pitch P3 (e.g., in a y-direction) and a second pitch P4 (e.g., in an x-direction) between respective neighboring pairs of the die connectors 36/38 within a quadrant of the area 80. Each of the first pitch P3 and the second pitch P4 of the die connectors 36/38 can be between about 20 µm and about 60 µm, such as about 40 µm. The first pitch P1 is greater than the first pitch P3, and the second pitch P2 is greater than the second pitch P4.

Figure 3:
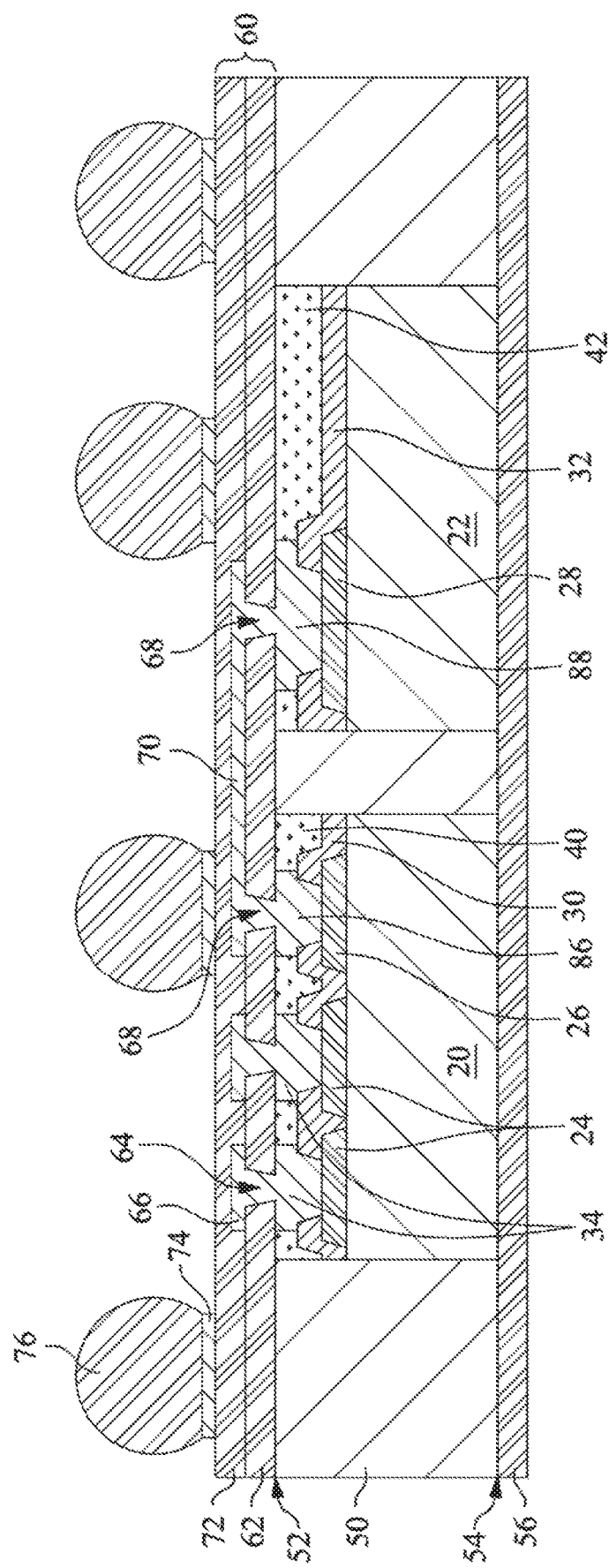
FIG. 3 illustrates a second package in accordance with some embodiments.
Figure 4B:
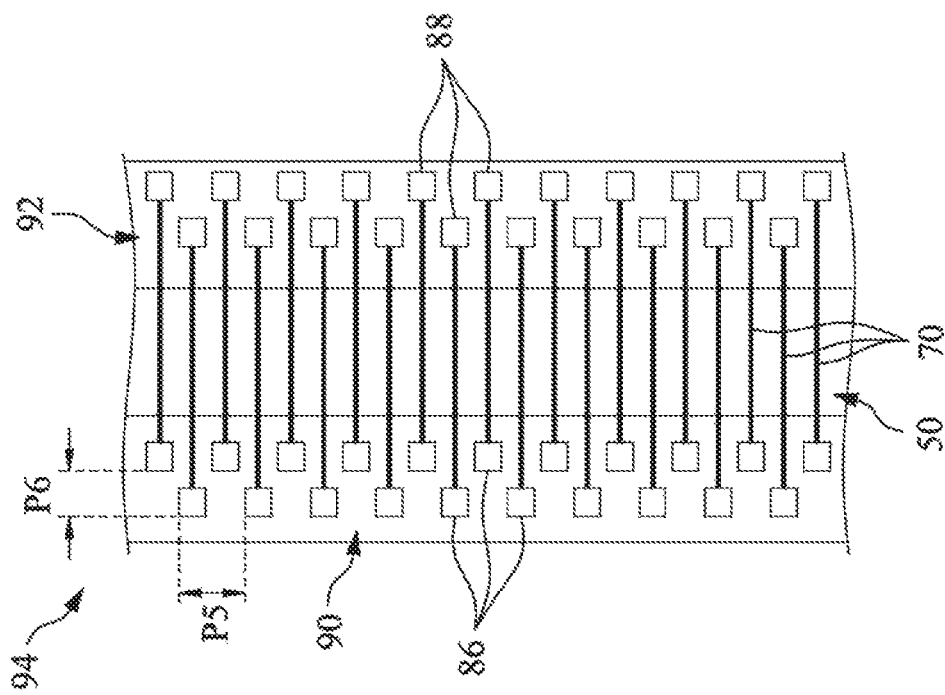
FIGS. 4A and 4B are layout views of a cross section of the second package of FIG. 3, and with overlaid die-to-die connections, in accordance with some embodiments.

FIG. 3 illustrates another package in accordance with some embodiments. The package of FIG. 3 is generally similar to the package of FIG. 1, and hence, common components depicted in FIG. 3 and FIG. 1 will not be discussed here for brevity. In this example, the second integrated circuit die 22 conforms to the JEDEC Double Data Rate (DDR) or Low Power DDR (LPDDR) standard specification. Die connectors 36 and 38 in the package of FIG. 1 are replaced with die connectors 86 and 88 in the package of FIG. 3. Additional details of these die connectors 86 and 88 are shown in FIGS. 4A and 4B.

Figure 4A:
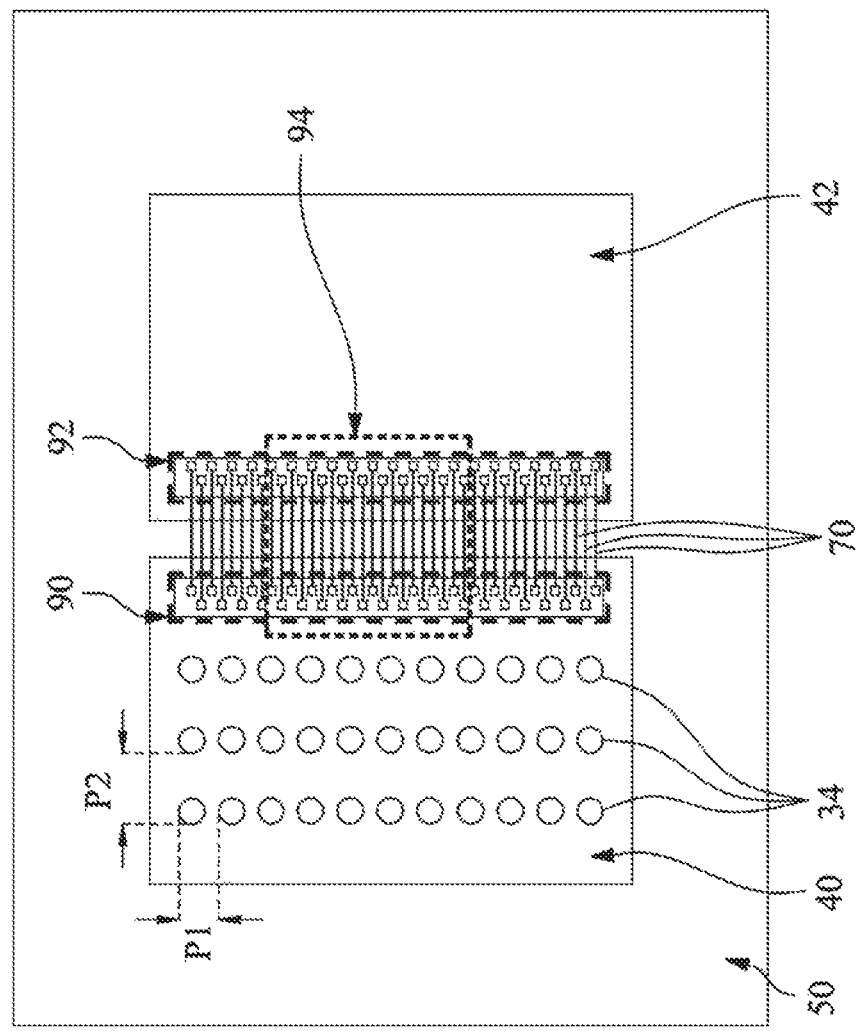

FIG. 4A is a layout view of the first surface 52 of the encapsulant 50, surfaces of the dielectric materials 40 and 42, surfaces of the die connectors 34, 86, and 88, and with overlaid die-to-die connections, in accordance with some embodiments. The die connectors 34 are generally arranged as discussed in FIG. 2A. The die connectors 86 are generally arranged in an area 90 on the first integrated circuit die 20, and the die connectors 88 are generally arranged in an area 92 on the second integrated circuit die 22. The areas 90 and 92 are generally located along and in regions proximate corresponding lateral edges of the respective first integrated circuit die 20 and the second integrated circuit die 22. Lines 70 are illustrated between the areas 90 and 92 to illustrate die-to-die connections between die connectors 86 of the first integrated circuit die 20 and die connectors 88 of the second integrated circuit die 22. A portion 94 of the areas 90 and 92 are generally depicted in greater detail in FIG. 4B. Die connectors 86 in the area 90 on the first integrated circuit die 20 are generally arranged in two columns parallel to the lateral edge of the first integrated circuit die 20 to which the area 90 is proximate, e.g., along a y-direction. The die connectors 86 are offset with respect to a direction perpendicular to the lateral edge of the first integrated circuit die 20 to which the area 90 is proximate, e.g., in a x-direction. Similarly, die connectors 88 in the area 92 on the second integrated circuit die 22 are generally arranged in two columns parallel to the lateral edge of the second integrated circuit die 22 to which the area 92 is proximate. The die connectors 88 are offset with respect to a direction perpendicular to the lateral edge of the second integrated circuit die 22 to which the area 92 is proximate. The die connectors 86 and 88 can have a first pitch P5 (e.g., in a y-direction) and a second pitch P6 (e.g., in an x-direction) between respective neighboring pairs of the die connectors 86 and 88 on a respective one of the first integrated circuit die 20 and the second integrated circuit die 22. Each of the first pitch P5 and the second pitch P6 of the die connectors 86 and 88 can be between about 40 µm and about 200 µm, such as about 80 µm. The first pitch P1 is greater than the first pitch P5, and the second pitch P2 is greater than the second pitch P6.

Figure 5:
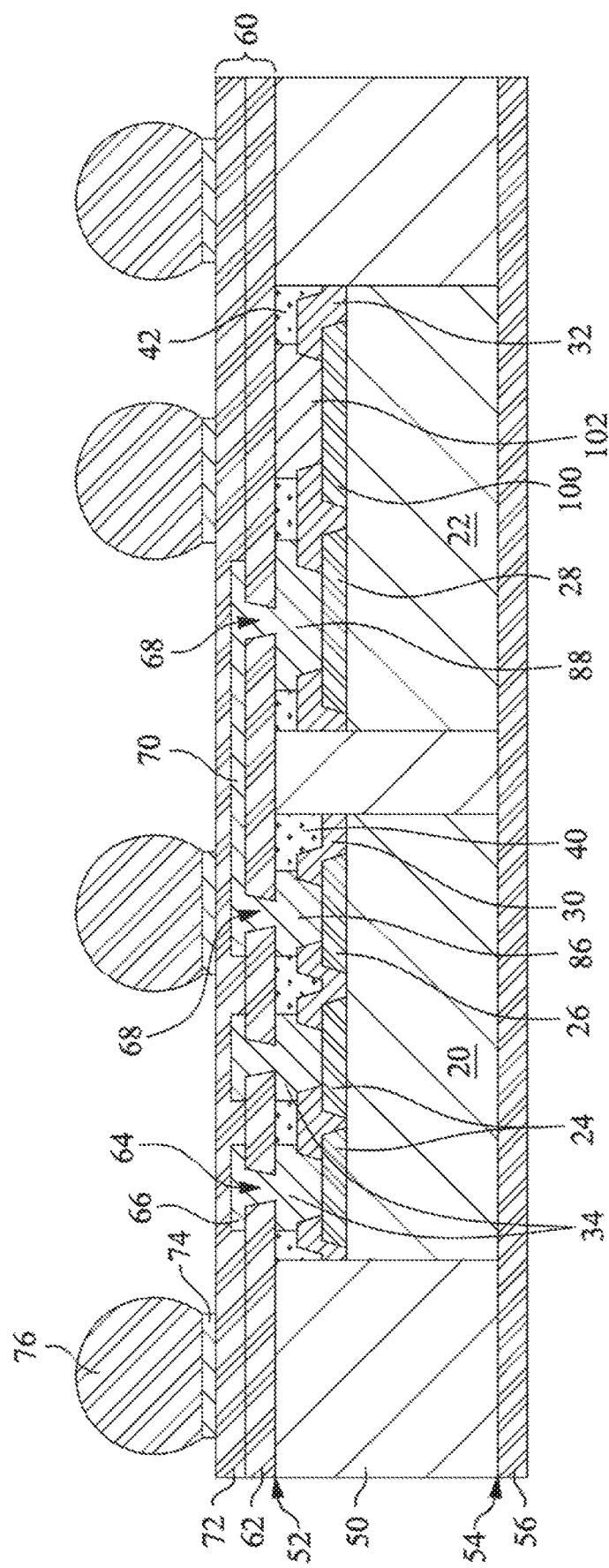
FIG. 5 illustrates a third package in accordance with some embodiments.

FIG. 5 illustrates another package in accordance with some embodiments. The package of FIG. 5 is generally similar to the package of FIG. 3, and hence, common components depicted in FIG. 5 and FIG. 3 will not be discussed here for brevity. The second integrated circuit die 22 further comprises dummy pads 100, such as aluminum pads, on the active side of the second integrated circuit die 22. The passivation film 32 is on portions of the dummy pads 100. Openings are through the passivation film 32 to the dummy pads 100. Dummy die connectors 102, such as conductive pillars (for example, comprising a metal such as copper), are in the openings through passivation film 32 and are mechanically coupled to the dummy pads 100. The dummy die connectors 102 and dummy pads 100 may not be electrically coupled to another device or conductive feature. A reduced number of dummy die connectors 102 is shown on the second integrated circuit die 22 for clarity and simplicity, and one of ordinary skill in the art will readily understand that more dummy die connectors may be present. Further, the relative sizes and/or pitches of the dummy die connectors may be exaggerated in the illustration to more clearly convey various concepts. More details of the dummy die connectors 102 are discussed with respect to FIG. 6.

Figure 6:
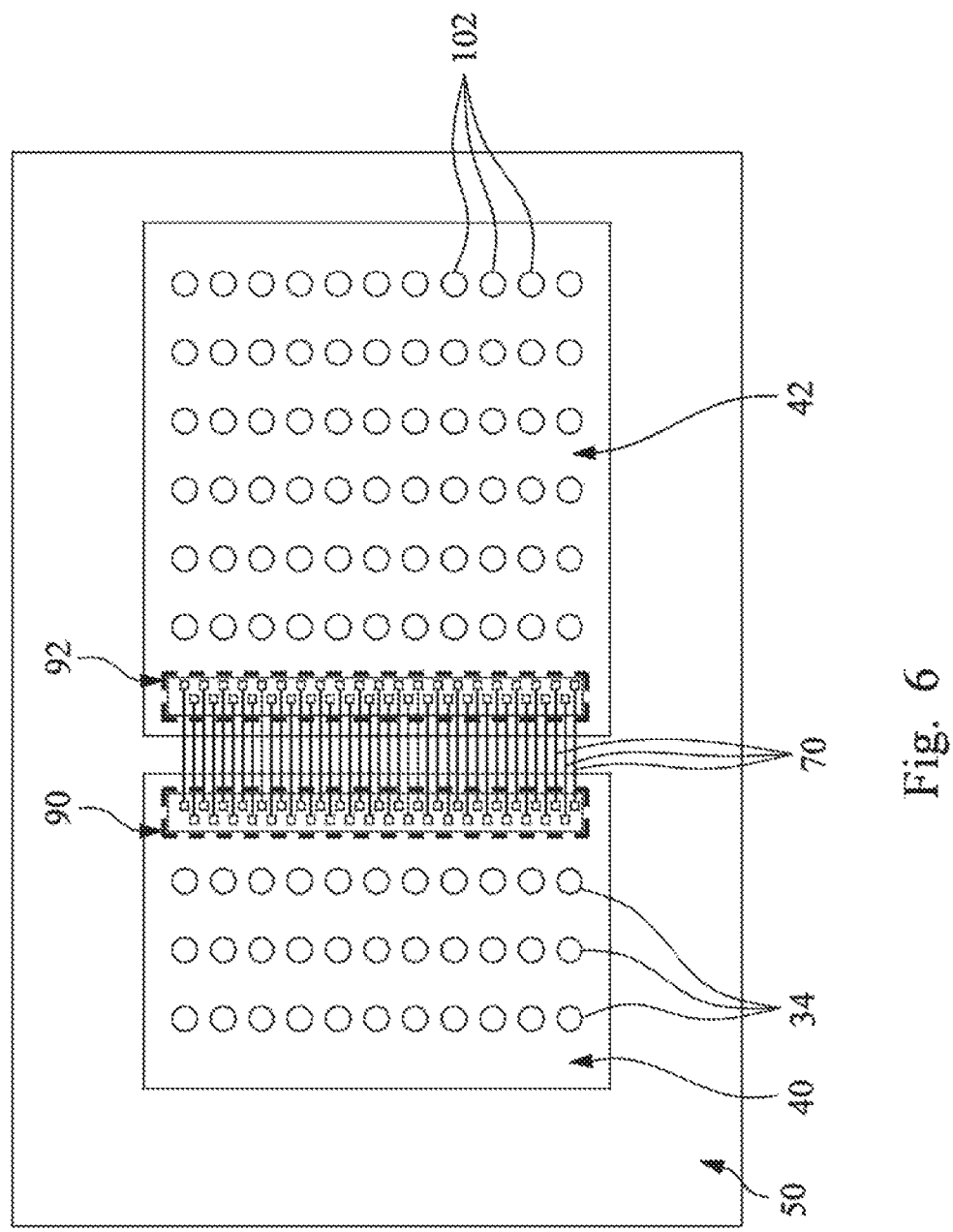
FIG. 6 is a layout view of a cross section of the third package of FIG. 5, and with overlaid die-to-die connections, in accordance with some embodiments.

FIG. 6 is a layout view of the first surface 52 of the encapsulant 50, surfaces of the dielectric materials 40 and 42, surfaces of the die connectors 34, 86, and 88, surfaces of dummy die connectors 102, and with overlaid die-to-die connections, in accordance with some embodiments. The layout view of FIG. 6 is generally the same as the layout view of FIG. 4A, with the additional detail depicted in FIG. 4B. Dummy die connectors 102 are generally arranged as an array on the second integrated circuit die 22 outside of the area 92. Any number of dummy die connectors 102 may be used, and the dummy die connectors 102 may be in any configuration with any size. The dummy die connectors 102 may increase processing uniformity in some processes used to form the package, such as during photolithography, plating, and/or etching processes, which will be discussed subsequently. Although FIGS. 5 and 6 are discussed in the context of the areas 90 and 92 discussed in FIGS. 3, 4A, and 4B, one of ordinary skill in the art will readily understand that the dummy die connectors 102 and dummy pads 100 can be incorporated into the package of FIGS. 1, 2A, and 2B.

Figure 7:
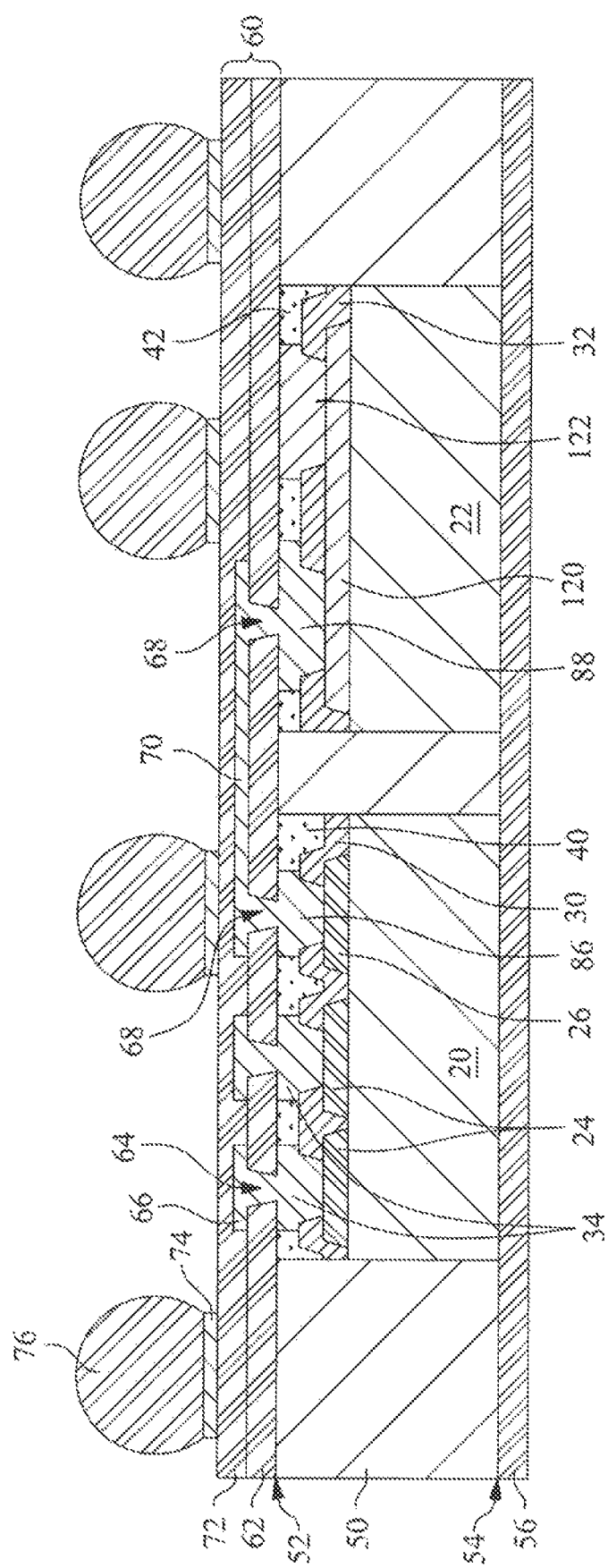
FIG. 7 illustrates a fourth package in accordance with some embodiments.

FIG. 7 illustrates another package in accordance with some embodiments. The package of FIG. 7 is generally similar to the package of FIG. 3, and hence, common components depicted in FIG. 7 and FIG. 3 will not be discussed here for brevity. Pads 28 on the second integrated circuit die 22 are replaced with pads 120, such as aluminum pads, on the second integrated circuit die 22. Each of the pads 120 may be an elongated pad, may comprise two pads with a line connecting the two pads, or the like. The passivation film 32 is on portions of the pads 120. Openings are through the passivation film 32 to the pads 120. Two openings may be through the passivation film 32 to each pad 120. Die connectors 88 and probe die connectors 122, such as conductive pillars (for example, comprising a metal such as copper), are in the openings through passivation film 32 and are electrically and mechanically coupled to the pads 120. For each pad 120, one die connector 88 may be in one opening to the pad 120, and one probe die connector 122 may be in another one opening to the pad 120. A reduced number of probe die connectors 122 is shown on the second integrated circuit die 22 for clarity and simplicity, and one of ordinary skill in the art will readily understand that more probe die connectors may be present. Further, the relative sizes and/or pitches of the probe die connectors may be exaggerated in the illustration to more clearly convey various concepts. More details of the probe die connectors 122 are discussed with respect to FIG. 8.

FIG. 8 is a layout view of the first surface 52 of the encapsulant 50, surfaces of the dielectric materials 40 and 42, surfaces of the die connectors 34, 86, and 88, surfaces of probe die connectors 122, and with overlaid die-to-die connections, in accordance with some embodiments. The layout view of FIG. 8 is generally the same as the layout view of FIG. 4A, with the additional detail depicted in FIG. 4B. Probe die connectors 122 are generally arranged as along and parallel to the area 92 on the second integrated circuit die 22. Any number of probe die connectors 122 may be used, and the probe die connectors 122 may be in any configuration with any size. Pads 120, such as lines, are shown electrically coupling respective ones of the die connectors 88 in area 92 and probe die connectors 122. The probe die connectors 122 and/or the underlying portions of the pads 120 to which the probe die connectors 122 are connected may be used to aid die testing. The probe die connectors 122 and/or the underlying portions of the pads 120 may generally have a larger size and pitch than the die connectors 88 in the area 92. Hence, probing the probe die connectors 122 and/or the underlying portions of the pads 120 may be easier than probing the die connectors 88 and/or the pads 28. Although FIGS. 7 and 8 are discussed in the context of the areas 90 and 92 discussed in FIGS. 3, 4A, and 4B, one of ordinary skill in the art will readily understand that the pads 120 and probe die connectors 122 can be incorporated into the package of FIGS. 1, 2A, and 2B, and further, that dummy pads and/or dummy die connectors may be further incorporated into either package.

Figure 11:
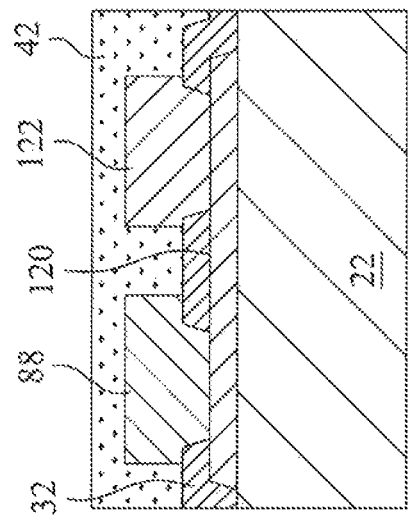
FIGS. 9 through 15 illustrate cross sectional views of intermediate steps during a process for forming a package in accordance with some embodiments.
Figure 10:
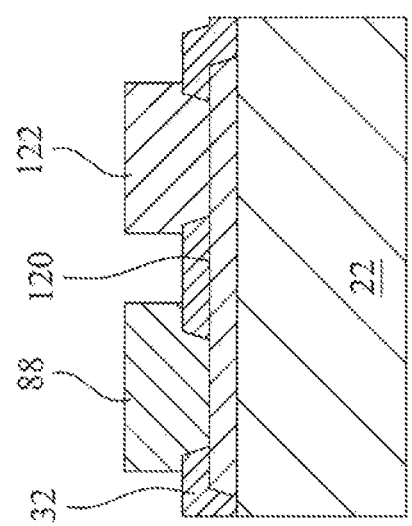
Figure 9:
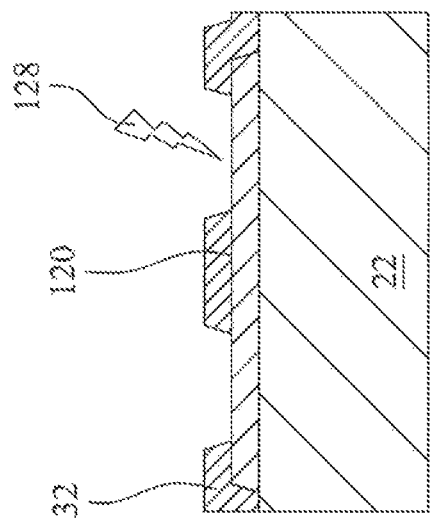

FIGS. 9 through 15 illustrate cross sectional views of intermediate steps during a process for forming a package in accordance with some embodiments. FIGS. 9 through 11 are cross sectional views during processing of the second integrated circuit die 22, and one of ordinary skill in the art will readily understand that the first integrated circuit die 20 may undergo similar processing.

In FIG. 9, pads are formed on the second integrated circuit die 22. Before processing in FIG. 9, the second integrated circuit die 22 may have been processed by other Back-End-Of-the-Line (BEOL) processes. For example, various metallization layers may have been formed on a semiconductor substrate of the second integrated circuit die 22, which may interconnect various devices formed on and/or above the semiconductor substrate to form an integrated circuit. The pads may be formed on a dielectric layer overlying the top metallization layer, and may be coupled to a metallization pattern in the top metallization layer. The pads 120 of FIGS. 7 and 8 are depicted in the embodiment of FIGS. 9 through 15. In other embodiments, pads 28, 100, and/or 120 may be formed of other figures. The pads may be formed by depositing a conductive material, such as a metal like aluminum, copper, a metal alloy, or the like, on the substrate by an acceptable deposition process, such as a chemical vapor deposition (CVD), physical vapor deposition (PVD), or the like. The conductive material may be patterned into the pads using acceptable photolithography and etching processes, for example.

Subsequently, the passivation film 32 is formed over the pads 120 and the substrate. The passivation film 32 may be a dielectric layer such as a silicon nitride, silicon oxide, or the like, deposited by CVD or the like. Openings exposing the pads 120 may be formed through the passivation film 32 using acceptable photolithography and etching processes, for example.

Then, as shown in FIG. 9, the second integrated circuit die 22 may undergo a chip-test. The testing may comprise applying a probe 128 to one or more of the pads 120 on the second integrated circuit die 22 and applying a signal from the probe 128 through the pads 120 to test various components in the second integrated circuit die 22. In embodiments where pads 120 are used, as depicted, the probe 128 may contact the pads 120 through openings in the passivation film 32 corresponding to the locations of the probe die connectors 122. In other embodiments, the probe 128 may contact pads through openings in the passivation film 32 corresponding to the locations of die connectors 38 or 88. In even further embodiments, the testing may be omitted.

In FIG. 10, die connectors are formed on the pads through openings in the passivation film 32. The die connectors may be any of die connectors 38, 88, 102, and/or 122 of other figures, although die connectors 88 and probe die connectors 122 of FIGS. 7 and 8 are depicted in the embodiment of FIGS. 9 through 15. As an example to form die connectors 88 and 122, a seed layer (not shown) is formed over the passivation film 32 and in and along surfaces of openings through the passivation film 32. In some embodiments, the seed layer is a metal layer, which may be a single layer or a composite layer comprising a plurality of sub-layers formed of different materials. In some embodiments, the seed layer comprises a titanium layer and a copper layer over the titanium layer. The seed layer may be formed using, for example, PVD or the like. A photo resist is then formed and patterned on the seed layer. The photo resist may be formed by spin coating or the like and may be exposed to light for patterning. The pattern of the photo resist corresponds to the die connectors 88 and 122. The patterning forms openings through the photo resist exposing the seed layer. A conductive material is formed in the openings of the photo resist and on the exposed portions of the seed layer. The conductive material may be formed by plating, such as electroplating or electroless plating, or the like. The conductive material may comprise a metal, like copper, titanium, tungsten, aluminum, or the like. Then, the photo resist and portions of the seed layer on which the conductive material is not formed are removed. The photo resist may be removed by an acceptable ashing or stripping process, such as using an oxygen plasma or the like. Once the photo resist is removed, exposed portions of the seed layer are removed, such as by using an acceptable etching process, such as by wet or dry etching. The remaining portions of the seed layer and conductive material form the die connectors 88 and 122.

In FIG. 11, dielectric material 42 is formed on the die connectors 88 and 122 and on the passivation film 32. The dielectric material 42 has a thickness sufficient to cover the exposed surfaces of the die connectors 88 and 122. The dielectric material 42 may be PBO, polyimide, BCB, or the like, formed by any acceptable deposition process, such as spin coating, laminating, or the like. One of ordinary skill in the art would understand that processing up to and including FIG. 11 may occur simultaneously on multiple second integrated circuit dies 22 on a single substrate, such as a wafer. After the dielectric material 42 is formed, the second integrated circuit dies 22 may be singulated, such as by dicing or sawing.

Figure 12:
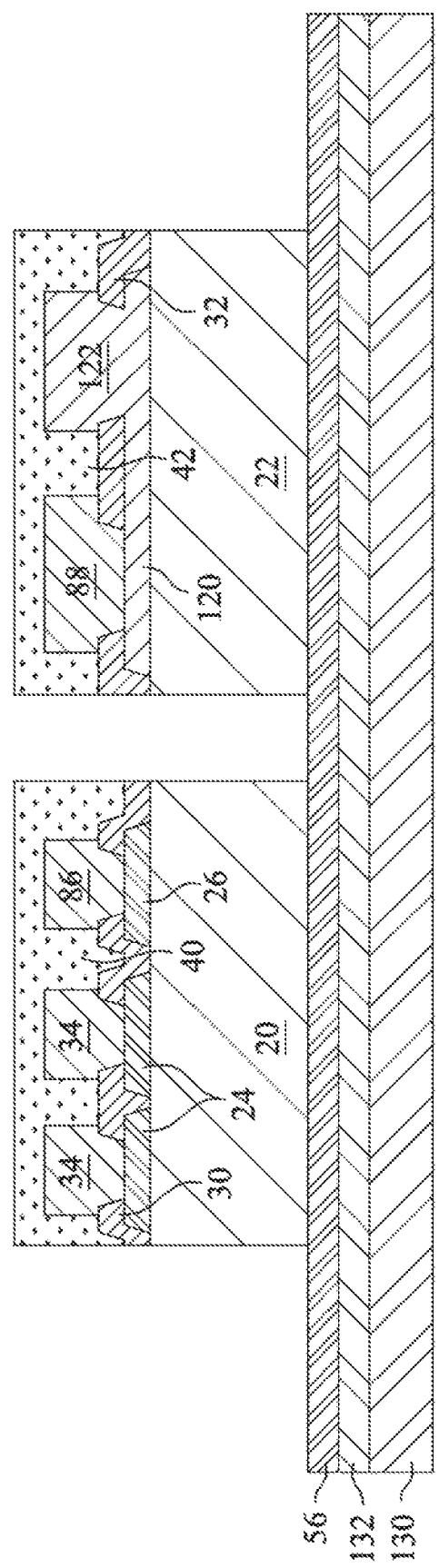

In FIG. 12, the first integrated circuit die 20 and the second integrated circuit die 22 are adhered to a carrier substrate 130. The carrier substrate 130 may be a glass carrier substrate, a ceramic carrier substrate, or the like. The carrier substrate 130 may be a wafer. A release layer 132 is on the carrier substrate 130, and the DAF 56 is on the release layer 132. The release layer 132 may be formed of a polymer-based material, which may be removed along with the carrier substrate 130 from the overlying structures that will be formed in subsequent steps. In some embodiments, the release layer 132 is an epoxy-based thermal-release material, which loses its adhesive property when heated, such as a Light-to-Heat-Conversion (LTHC) release coating. In other embodiments, the release layer 132 may be an ultra-violet (UV) glue, which loses its adhesive property when exposed to UV light. The release layer 132 may be dispensed as a liquid and cured, may be a laminate film laminated onto the carrier substrate 130, or may be the like. The DAF 56 may be an adhesive applied on the release layer that adheres the first integrated circuit die 20 and the second integrated circuit die 22 to the carrier substrate 130.

Figure 13:
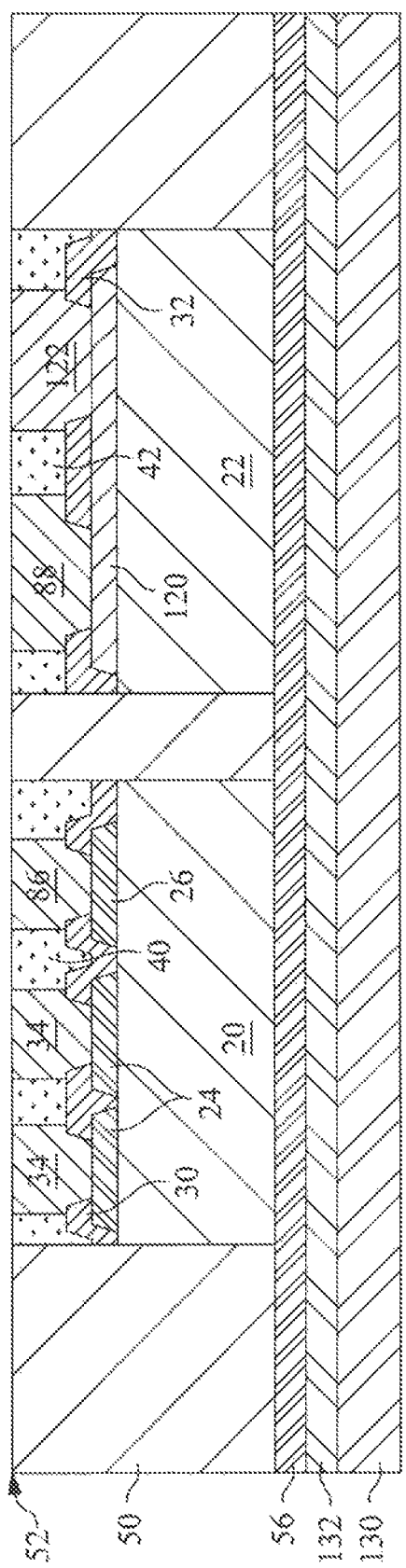

In FIG. 13, the encapsulant 50 is applied to encapsulate the first integrated circuit die 20 and the second integrated circuit die 22. The encapsulant 50 may be a molding compound, epoxy, or the like, and may be applied by compression molding, transfer molding, or the like. After curing, the encapsulant 50 may undergo a grinding process to expose the die connectors 34, 86, 88, and 122. Top surfaces of the die connectors 34, 86, 88, and 122, dielectric materials 40 and 42, and encapsulant 50 are co-planar after the grinding process. In some embodiments, the grinding may be omitted, for example, if the die connectors 34, 86, 88, and 122 are already exposed after the encapsulation process.

Figure 14:
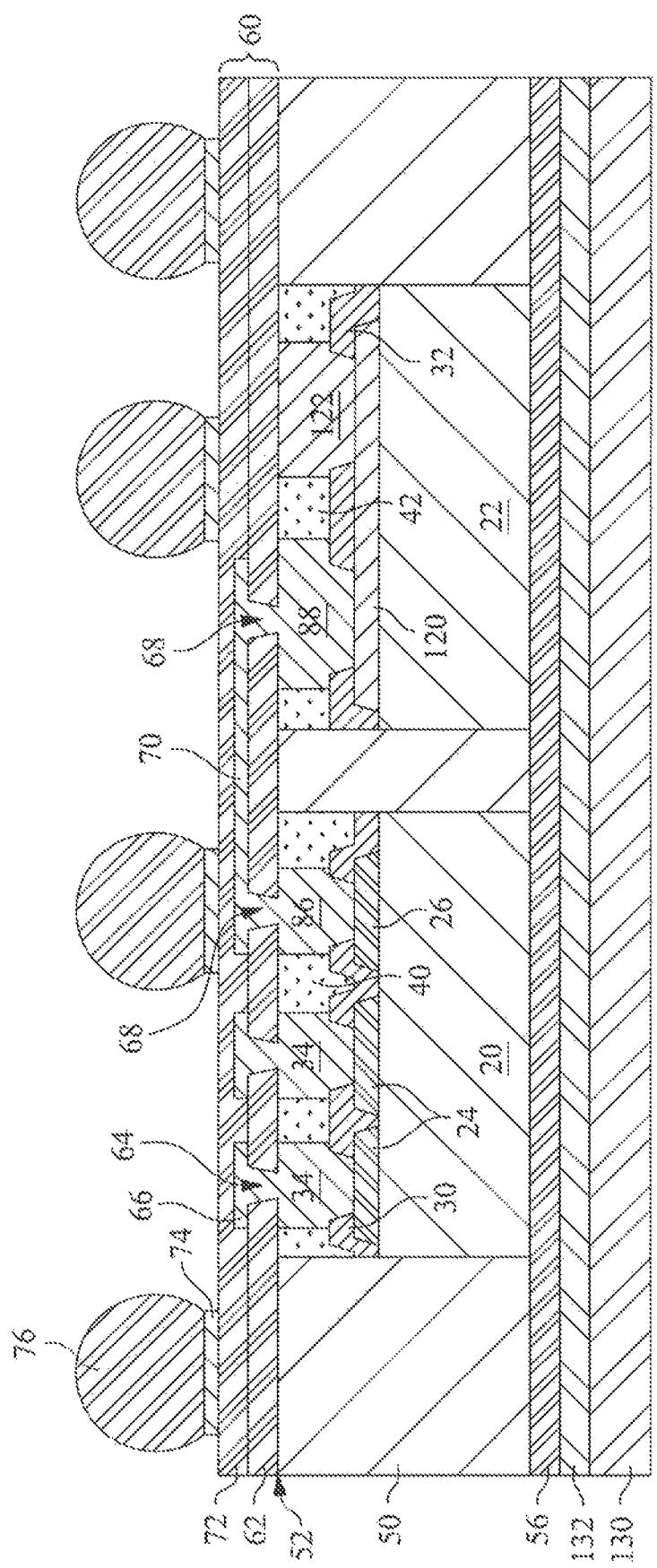

In FIG. 14, a redistribution structure 60 and external electrical connectors 76 are formed. The redistribution structure 60 can comprise any number of dielectric layers, metallization patterns, and vias. As illustrated, the redistribution structure 60 includes a first dielectric layer 62, a second dielectric layer 72, a metallization pattern 66, and various vias.

The first dielectric layer 62 is formed on the encapsulant 50, dielectric materials 40 and 42, and die connectors 34, 86, 88, and 122. In some embodiments, the first dielectric layer 62 is formed of a polymer, which may be a photo-sensitive material such as PBO, polyimide, BCB, or the like, that may be easily patterned using a lithography mask. In other embodiments, the first dielectric layer 62 is formed of a nitride such as silicon nitride; an oxide such as silicon oxide, PSG, BSG, BPSG; or the like. The first dielectric layer 62 may be formed by spin coating, lamination, CVD, the like, or a combination thereof. The first dielectric layer 62 is then patterned to form openings to expose portions of the die connectors 34, 86, and 88. The patterning may be by an acceptable process, such as by exposing the first dielectric layer 62 to light when the dielectric layer is a photo-sensitive material or by etching using, for example, an anisotropic etch.

Metallization pattern 66 with vias is formed first on the first dielectric layer 62. As an example to form metallization pattern 66, a seed layer (not shown) is formed over the first dielectric layer 62. In some embodiments, the seed layer is a metal layer, which may be a single layer or a composite layer comprising a plurality of sub-layers formed of different materials. In some embodiments, the seed layer comprises a titanium layer and a copper layer over the titanium layer. The seed layer may be formed using, for example, PVD or the like. A photo resist is then formed and patterned on the seed layer. The photo resist may be formed by spin coating or the like and may be exposed to light for patterning. The pattern of the photo resist corresponds to the metallization pattern 66 and vias. The patterning forms openings through the photo resist exposing the seed layer. A conductive material is formed in the openings of the photo resist and on the exposed portions of the seed layer. The conductive material may be formed by plating, such as electroplating or electroless plating, or the like. The conductive material may comprise a metal, like copper, titanium, tungsten, aluminum, or the like. Then, the photo resist and portions of the seed layer on which the conductive material is not formed are removed. The photo resist may be removed by an acceptable ashing or stripping process, such as using an oxygen plasma or the like. Once the photo resist is removed, exposed portions of the seed layer are removed, such as by using an acceptable etching process, such as by wet or dry etching. The remaining portions of the seed layer and conductive material form the metallization pattern 66 and vias through the first dielectric layer 62. The vias include vias 64 directly coupling the metallization pattern 66 to the die connectors 34, and vias 68 directly coupling the die connectors 86 and 88 to the line 70 of the metallization pattern 66.

The second dielectric layer 72 is formed on the metallization pattern 66 and the first dielectric layer 62. In some embodiments, the second dielectric layer 72 is formed of a polymer, which may be a photo-sensitive material such as PBO, polyimide, BCB, or the like, that may be easily patterned using a lithography mask. In other embodiments, the second dielectric layer 72 is formed of a nitride such as silicon nitride; an oxide such as silicon oxide, PSG, BSG, BPSG; or the like. The second dielectric layer 72 may be formed by spin coating, lamination, CVD, the like, or a combination thereof. The second dielectric layer 72 is then patterned to form openings to expose portions of the metallization pattern 66. The patterning may be by an acceptable process, such as by exposing the second dielectric layer 72 to light when the dielectric layer is a photo-sensitive material or by etching using, for example, an anisotropic etch.

One or more additional metallization pattern and dielectric layer may be formed in the redistribution structure 60 by repeating the processes for forming a metallization pattern and dielectric layer. The vias may be formed during the formation of a metallization pattern by forming the seed layer and conductive material of the metallization pattern in openings of the second dielectric layer. The vias may therefore interconnect and electrically couple the various metallization patterns.

The bond pads 74 are formed on an exterior surface of the redistribution structure 60. In the illustrated embodiment, bond pads 74 include vias (not illustrated) through openings in the second dielectric layer 72. As an example to form the bond pads 74, a seed layer (not shown) is formed over the second dielectric layer 72. In some embodiments, the seed layer is a metal layer, which may be a single layer or a composite layer comprising a plurality of sub-layers formed of different materials. In some embodiments, the seed layer comprises a titanium layer and a copper layer over the titanium layer. The seed layer may be formed using, for example, PVD or the like. A photo resist is then formed and patterned on the seed layer. The photo resist may be formed by spin coating or the like and may be exposed to light for patterning. The pattern of the photo resist corresponds to the bond pads 74. The patterning forms openings through the photo resist exposing the seed layer. A conductive material is formed in the openings of the photo resist and on the exposed portions of the seed layer. The conductive material may be formed by plating, such as electroplating or electroless plating, or the like. The conductive material may comprise a metal, like copper, titanium, tungsten, aluminum, or the like. Then, the photo resist and portions of the seed layer on which the conductive material is not formed are removed. The photo resist may be removed by an acceptable ashing or stripping process, such as using an oxygen plasma or the like. Once the photo resist is removed, exposed portions of the seed layer are removed, such as by using an acceptable etching process, such as by wet or dry etching. The remaining portions of the seed layer and conductive material form the bond pads 74, which can include lines and the vias where the lines and vias electrically couple the bond pads 74 to the metallization pattern 66. The vias are formed in openings in the second dielectric layer 72.

The external electrical connectors 76 are formed on the pads 116. The external electrical connectors 76 may include a low-temperature reflowable material such as solder, which may be lead-free or lead-containing. The external electrical connectors 76 may be formed by using an appropriate ball drop process. In other embodiments where the pads 116 are omitted, the external electrical connectors are formed directly on the metallization pattern 66 through various openings in the second dielectric layer 72.

Figure 15:
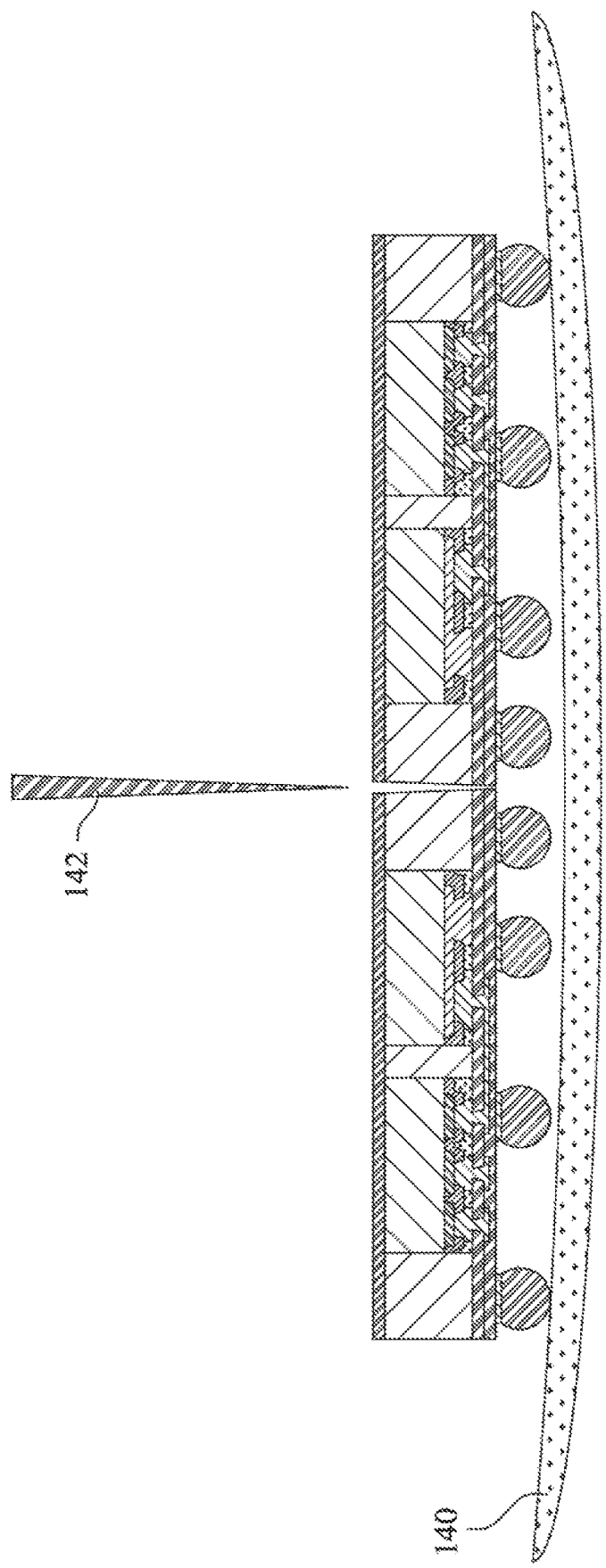

One having ordinary skill in the art will readily understand that processing through FIG. 14 may be performed on a carrier substrate 130 that is a wafer, as discussed above, and hence, multiple package structures may be formed on a single carrier substrate 130. FIG. 15 illustrates singulating the packages. Before singulation, the carrier substrate 130 is de-bonded (or detached) from the package structures. In accordance with some embodiments, the de-bonding includes projecting a light such as a laser light or an UV light on release layer 132 so that release layer 132 decomposes under the heat of the light and carrier substrate 130 can be removed. A cleaning and/or grinding process may be performed to remove residual portions of the release layer 132 and/or the DAF 56. The package structure is then flipped over and placed on a tape 140. The packages are singulated, for example, by sawing between the packages with a saw 142.

Embodiments may achieve advantages. In some embodiments, memory may be removed from a processor die and still be in close proximity to the processor die. As discussed in embodiments above, the first integrated circuit die 20 can be a CPU or an APU, and the second integrated circuit die 22 can be DRAM. As shown in the examples, the CPU/APU can be communicatively coupled to the DRAM through the redistribution structure of the package without any connections external to the package. Packages as discussed above may allow the DRAM to be a cache for the CPU/APU. Further, using DRAM may be more area efficient than other memories, such as Static Random Access Memory (SRAM), that may be used as a cache. DRAM can also have a high bandwidth, such as 51 gigabytes/second (GB/s) for the JEDEC Wide I/O or Wide I/O 2 standard or 25.6 GB/s for the JEDEC LPDDR4 standard. These advantages may further aid to commoditize a processor product.

An embodiment is a package. The package includes a processor die at least laterally encapsulated by an encapsulant, a memory die at least laterally encapsulated by the encapsulant, and a redistribution structure on the encapsulant. The processor die is communicatively coupled to the memory die through the redistribution structure.

Another embodiment is a package. The package includes an encapsulant, a first die embedded in the encapsulant, and a second die embedded in the encapsulant. The first die comprises processor integrated circuitry. A first pad is on an active side of the first die, and a first die connector is on the first pad. The second die comprises memory integrated circuitry. A second pad is on an active side of the second die, and a second die connector is on the second pad. A surface of the first die connector, a surface of the second die connector, and a surface of the encapsulant are a co-planar surface. The package further includes a redistribution structure on the co-planar surface. The first die is communicatively coupled to the second die through the first die connector, the redistribution structure, and the second die connector.

A further embodiment is a method. The method includes encapsulating a first die and a second die in an encapsulant and forming a redistribution structure on the encapsulant. The first die comprises a processor, and the second die comprises memory. The redistribution structure electrically couples the first die to the second die.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A structure comprising:
   a first die embedded in an encapsulant, a first pad being on an active side of the first die, a first die connector being on the first pad, the first pad having a first width and the first die connector having a second width, the first and second widths being measured in a first direction, the first direction being parallel to the active side of the first die;
   a second die embedded in the encapsulant, a second pad being on an active side of the second die, a second die connector contacting the second pad, the second pad having a third width and the second die connector having a fourth width, the third and fourth widths being measured in the first direction, the fourth width being less than the third width; and
   a redistribution structure over the encapsulant, the first die, and the second die, the first die being electrically coupled to the second die through the first die connector, the redistribution structure, and the second die connector.

2. The structure of claim 1, wherein the second width is less than the first width.

3. The structure of claim 1 further comprising:
   a third die connector contacting the second pad, a size of the third die connector being greater than a size of the second die connector.

4. The structure of claim 1, wherein a surface of the first die connector, a surface of the second die connector, and a surface of the encapsulant are level with each other.

5. The structure of claim 1, wherein the second die further has a third pad on the active side of the second die, a fourth die connector being on the third pad, the fourth die connector being electrically isolated from the redistribution structure.

6. The structure of claim 5, wherein the redistribution structure comprises a first dielectric layer and a metallization pattern over the first dielectric layer, the first dielectric layer physically contacting the encapsulant, the first and second die connectors being electrically coupled to the metallization pattern by vias, the fourth die connector being electrically isolated from the metallization pattern of the redistribution structure.

7. The structure of claim 1, wherein the redistribution structure further comprises:
a first via directly connected to the first die connector;
a second via directly connected to the second die connector; and
a metal layer directly connected to both the first and second vias, the first die connector being electrically coupled to the second die connector through the first via, the metal layer, and the second via of the redistribution structure.

8. The structure of claim 1, wherein the first die is a processor die.

9. The structure of claim 1, wherein the second die is a memory die.

10. A structure comprising:
a processor die encapsulated by an encapsulant, the processor die having a first die connector on an active side of the processor die;
a memory die encapsulated by the encapsulant, the memory die having a second die connector and a third die connector on an active side of the memory die, surfaces of the first die connector, the second die connector, the third die connector, and the encapsulant being level; and
a redistribution structure on the encapsulant, the processor die, and the memory die, the processor die being electrically coupled to the memory die through the second die connector, the redistribution structure, and the first die connector, wherein the third die connector is not electrically coupled to the redistribution structure.

11. The structure of claim 10, wherein the memory die is a Wide Input/Output die or a Wide Input/Output 2 die.

12. The structure of claim 10, wherein the memory die comprises memory that is a cache of the processor die.

13. The structure of claim 10, wherein the processor die further comprises a first plurality of die connectors and a second plurality of die connectors on the active side of the processor die, the first die connector being one of the first plurality of die connectors, the first plurality of die connectors having a first pitch and being in a first area of the active side of the processor die, the second plurality of die connectors having a second pitch and being in a second area of the active side of the processor die, the second pitch being larger than the first pitch.

14. The structure of claim 10, wherein the memory die further comprises a first pad on an active side of the memory die, the second die connector contacting the first pad, the first pad having a first width and the second die connector having a second width, the first and second widths being measured in a first direction, the first direction being parallel to the active side of the memory die, the second width being less than the first width.

15. A structure comprising:
a first die connector on an active side a processor die;
a second die connector on an active side a memory die;
an encapsulant laterally encapsulating the processor die and the memory die;
a dielectric layer on the encapsulant, the first die connector, and the second die connector; and
a redistribution line extending from the first die connector to the second die connector, the redistribution line comprising:
a first conductive via portion extending through the dielectric layer, the first conductive via portion being directly coupled to the first die connector;
a second conductive via portion extending through the dielectric layer, the second conductive via portion being directly coupled to the second die connector; and
a conductive line portion being continuous with both the first and second conductive via portions, the conductive line portion overlying the dielectric layer, the first die connector being electrically coupled to the second die connector through the first conductive via portion, the conductive line portion, and the second conductive via portion.

16. The structure of claim 15 further comprising:
a first plurality of die connectors and a second plurality of die connectors on the active side of the processor die, the first plurality of die connectors having a first pitch and being in a first area of active side of the processor die, the second plurality of die connectors having a second pitch and being in a second area of active side of the processor die, the second pitch being smaller than the first pitch.

17. The structure of claim 15, wherein the memory die is a cache of the processor die.

18. The structure of claim 15 further comprising:
a dummy die connector on the active side of the memory die, the dummy die connector being electrically isolated from the second die connector.

19. The structure of claim 15, wherein the memory die has the second die connector on a pad on the active side of the memory die, the memory die further having a third die connector on the pad, the third die connector being distinct from the second die connector.

20. The structure of claim 19, wherein a size of the third die connector is greater than a size of the second die connector.

* * * * *